(12) United States Patent
Ramirez

(10) Patent No.: US 9,121,883 B2
(45) Date of Patent: Sep. 1, 2015

(54) MAGNETIC TAMPERING DETECTION AND CORRECTION IN A UTILITY METER

(75) Inventor: Anibal Diego Ramirez, Indianapolis, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 362 days.

(21) Appl. No.: 13/274,271

(22) Filed: Oct. 14, 2011

(65) Prior Publication Data

US 2013/0093418 A1    Apr. 18, 2013

(51) Int. Cl.
| | | |
|---|---|---|
| *G01R 1/00* | (2006.01) | |
| *G01R 33/02* | (2006.01) | |
| *G01R 11/17* | (2006.01) | |
| *G01R 22/06* | (2006.01) | |
| *G01R 11/24* | (2006.01) | |

(52) U.S. Cl.
CPC ............ *G01R 33/02* (2013.01); *G01R 11/17* (2013.01); *G01R 22/066* (2013.01); *G01R 11/24* (2013.01)

(58) Field of Classification Search
CPC ......... G01R 11/18; G01R 11/00; G01R 11/24
USPC .................................. 324/244, 246, 110, 260
See application file for complete search history.

(56) References Cited

U.S. PATENT DOCUMENTS

| | | | | |
|---|---|---|---|---|
| 4,278,940 | A  * | 7/1981  | Milkovic ....................... | 324/127 |
| 4,707,679 | A  * | 11/1987 | Kennon et al. ................ | 340/538 |
| 5,086,292 | A  * | 2/1992  | Johnson et al. ............... | 340/637 |
| 6,847,901 | B2 * | 1/2005  | Suzuki et al. .................. | 702/38 |
| 7,495,555 | B2 * | 2/2009  | Seal et al. ...................... | 340/551 |
| 2005/0035914 | A1* | 2/2005 | Winter ......................... | 343/719 |
| 2005/0194962 | A1* | 9/2005 | Briese et al. .................. | 324/142 |
| 2006/0095219 | A1* | 5/2006 | Bruno ............................ | 702/64 |
| 2009/0001964 | A1* | 1/2009 | Strzalkowski ................ | 324/202 |
| 2009/0073738 | A1* | 3/2009 | Lenssen ........................ | 365/53 |
| 2010/0023174 | A1* | 1/2010 | Nagata et al. ................. | 700/287 |
| 2010/0072990 | A1* | 3/2010 | Edwards ................... | 324/207.25 |
| 2013/0088353 | A1* | 4/2013 | LaFrance ..................... | 340/551 |

* cited by examiner

*Primary Examiner* — Huy Q Phan
*Assistant Examiner* — Dustin Dickinson
(74) *Attorney, Agent, or Firm* — Maginot, Moore & Beck LLP

(57) ABSTRACT

An arrangement for use in an electricity meter includes a sensor and a processing circuit. The sensor is supported directly or indirectly by a meter housing. The sensor is configured to measure a magnetic field in proximity to a current sensor of the electricity meter. The sensor is also configured to generate a measurement signal representative of, at least in part, a magnitude of the magnetic field. The processing circuit is operably coupled to receive first information representative of the measurement signal. The processing circuit is configured to obtain a first value representative of the magnetic field based on the first information, and determine a first adjustment value responsive to a determination that the first value exceeds the first threshold value. The processing circuit is further configured to generate energy consumption information based at least in part on the first adjustment value.

18 Claims, 5 Drawing Sheets

MAGNETIC TAMPERING DETECTION AND CORRECTION IN A UTILITY METER

FIELD OF THE INVENTION

The present invention relates to utility meters, and particularly, to electricity meter for use in commercial, industrial and residential electrical services.

BACKGROUND

Electrical service providers such as electrical utilities employ electricity meters to monitor energy consumption by customers (or other entities). Electricity meters track the amount of energy consumed by a load (e.g. the customer), typically measured in kilowatt-hours ("kwh"), at each customer's facility. The service provider uses the consumption information primarily for billing, but also for resource allocation forecasting and other purposes.

Electricity meter tampering is a form of energy theft that can have significant impact on costs for utilities and paying customers. Electricity meter tampering typically involves modification of the meter to bypass, alter or disconnect the consumption metering function of the meter, such that less than all of the actual energy consumption is registered.

An emerging type of meter tampering involves the use of a high power magnet. In particular, electricity meters using standard current transformers ("CTs") are susceptible to tampering using high-power magnetics. To this end, the CT current sensor behavior can be impacted if a large magnet such as a neodymium iron boron magnet (sometimes referred to as a rare earth magnet) is placed in close proximity. The high intensity magnetic field will result in an error in sensing current and potentially a significant under-registration of (and consequent underbilling for) energy consumed.

To combat this issue, it has been known to place a ferromagnetic shielding structure around the CT or the entire interior of the meter to reduce the impact of the magnetic field on interior components. However, magnetic shielding requires additional material and labor cost, and undesirably increases the weight of the meter.

It is also known to employ a sensor to detect and flag a potential tampering situation. See U.S. Patent Publication No. 2010/0072990 and U.S. Pat. No. 7,495,555 for examples of this method. However, even when tampering is detected and flagged, some revenue loss nevertheless occurs due to either delay in fixing the tampering situation. Even if service is immediately disconnected from the load, there is lost revenue.

There is a need, therefore, for a more cost-effective approach to combating this type of meter tampering that further reduces the revenue lost due to tampering.

SUMMARY

At least some embodiments of the present invention address the above-referenced issue by employing an arrangement that generates energy consumption value based on a correction value, the correction value corresponding to a detected magnetic field.

A first embodiment is an arrangement for use in an electricity meter that includes a sensor and a processing circuit. The sensor is supported directly or indirectly by a meter housing. The sensor is configured to measure a magnetic field proximate a current sensor of the electricity meter. The sensor is also configured to generate a measurement signal representative of, at least in part, a magnitude of the magnetic field. The processing circuit is operably coupled to receive first information representative of the measurement signal. The processing circuit is configured to obtain a first value representative of the magnetic field based on the first information, and determine a first adjustment value to a determination that the first value exceeds the first threshold value. The processing circuit is further configured to generate energy consumption information based at least in part on the first adjustment value.

The generated energy consumption value may suitably be representative of the magnetic field-induced error between the normally generated energy consumption values and the actual energy consumption. Alternatively, the generated energy consumption value may represent a corrected total energy consumption value. With these values, the amount of energy consumed may be estimated, providing information from which lost revenue may be recovered.

The above-described features and advantages, as well as others, will become more readily apparent to those of ordinary skill in the art by reference to the following detailed description and accompanying drawings.

DETAILED DESCRIPTION

Figure 1:
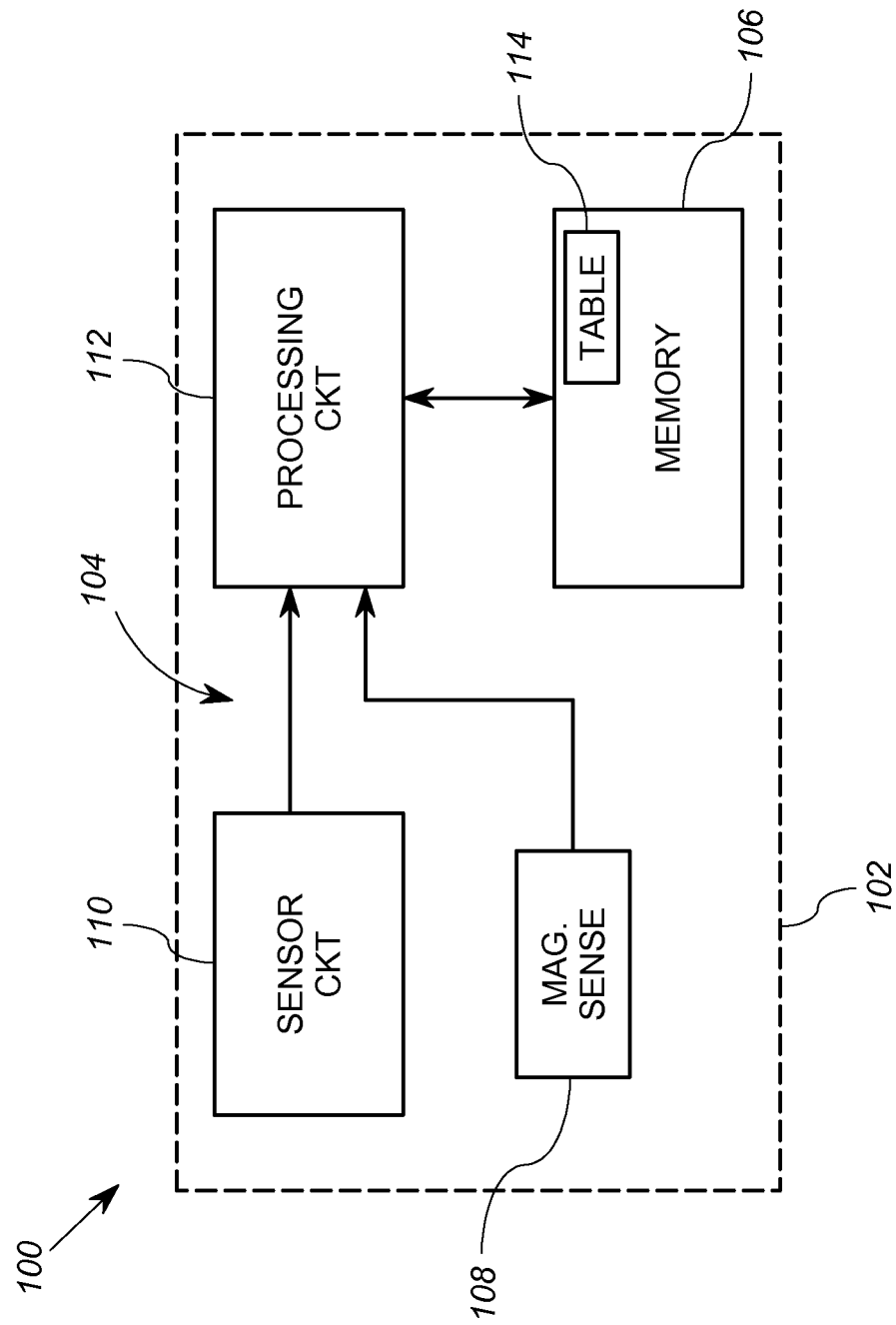
FIG. 1 is a schematic block diagram of an arrangement according to a first exemplary embodiment of the invention.

FIG. 1 shows an arrangement 100 for use in an electricity meter for detecting and compensating for distortion due to an extraneous magnetic field. The arrangement includes a meter housing 102, which supports a metrology circuit 104, a memory 106, a magnetic sensor 108, and a processing circuit 112. The processing circuit 112 may suitably also form part of the metrology circuit 104.

Figure 2:
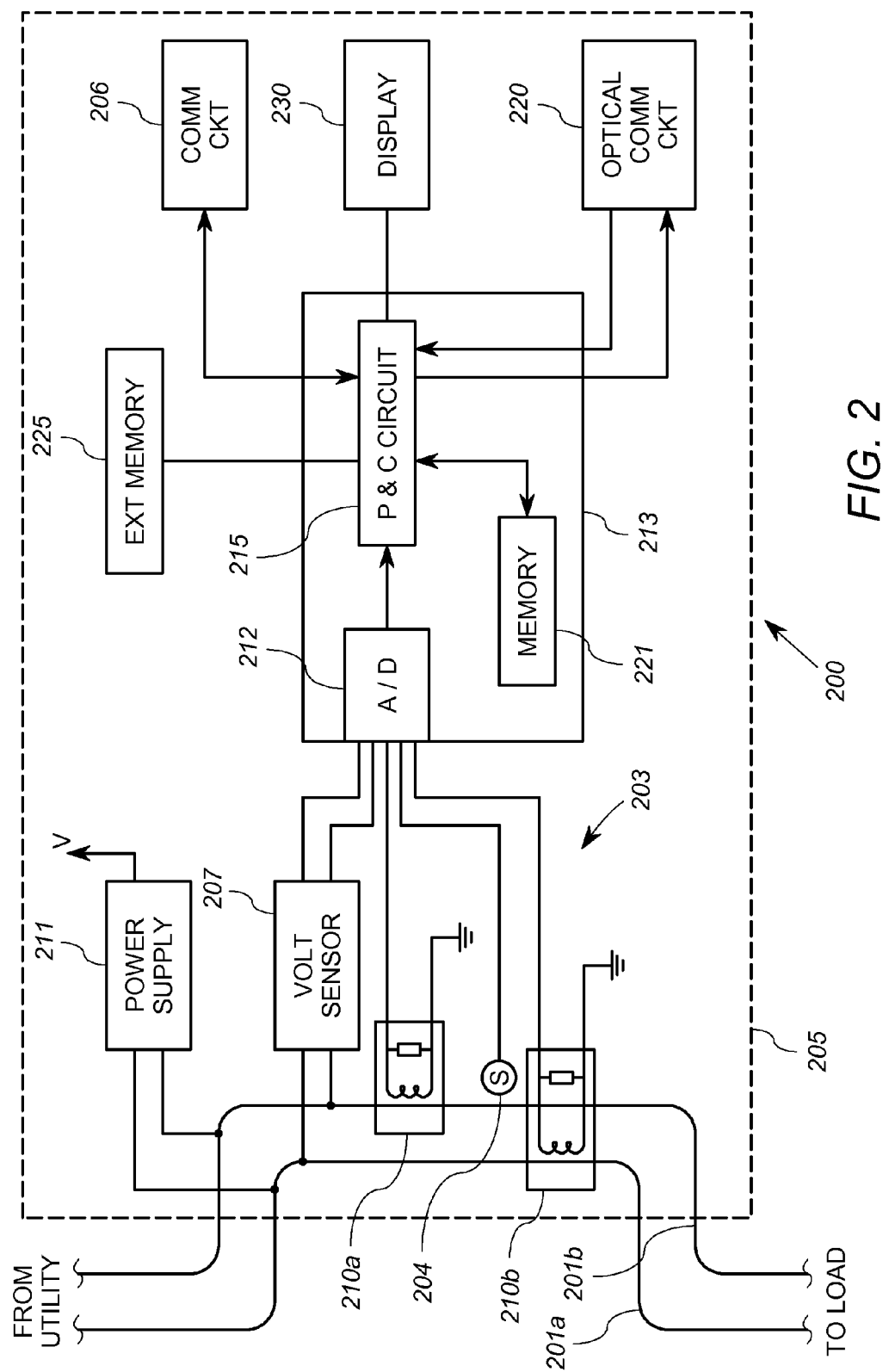
FIG. 2 is a schematic block diagram of an electricity meter according to a second exemplary embodiment of the invention.

The metrology circuit 104 is any suitable circuit that is configured to detect electricity delivered to the metered load, not shown in FIG. 1, and generate energy consumption-related information therefrom. Such circuits are well-known in the art. In this embodiment, the metrology circuit 104 includes a sensor circuit 110 and at least some of the functions of the processing circuit 112. The sensor circuit 110 in this embodiment includes voltage sensors and current sensors, not shown in FIG. 1, which sense electricity delivered to the load, and generate analog electricity measurement signals therefrom. The processing circuit 112 includes circuitry that converts the analog electricity measurement signals to digital measurement signals, and digital processing circuitry that calculates various energy-consumption related values based on the digital measurement signals. Such circuits in many forms are well known in the art. FIG. 2, discussed below, shows in further detail an exemplary embodiment of a metrology circuit for an electricity meter.

The memory 106 in this drawing is representative of non-volatile memory, such as flash memory or the like. However, it will be appreciated that the memory 106 may also be non-volatile RAM, or even volatile memory. The processing circuit 112 also includes working memory, such as RAM, as is known in the art. The memory 106 includes, among other things, a table 114 that correlates detected magnetic field values to adjustments in energy calculations. In particular, different magnitudes of magnetic fields can affect the sensor circuit 110 differently, with stronger magnetic fields causing more effect than weaker magnetic fields. Such effects create error that is largely repeatable and predictable. Accordingly, for each of plurality of a magnetic field values, a suitable compensation or error factor may be identified. As will be discussed below in detail, the compensation or error factor may then be used as an adjustment in the metrology circuit 104. Determination of the contents of the table 114 may suitably be carried out experimentally, by applying different magnetic fields to the sensor circuit 110 and determining the error in the uncompensated measured energy by the processing circuit 112. An exemplary method of determining the contents of the table 114 is discussed further below in connection with FIG. 5.

The magnetic sensor 108 is a device that is configured to measure a magnetic field in proximity to the sensor circuit 110, and preferably a current sensor thereof. The magnetic sensor 108 is further configured to generate a magnetic measurement signal representative of, at least in part, a magnitude of the magnetic field. In accordance with a first exemplary embodiment, the magnetic sensor 108 is a Hall-effect sensor. In other embodiments, the magnetic sensor 108 may be a GMR ("giant magnetic resistive") sensor.

In addition to the operations as part of the metrology circuit, the processing circuit 112 is operably coupled to receive the magnetic measurement signal. In this embodiment, the processing circuit 112 includes analog to digital conversion means (not shown in FIG. 1) and is therefore configured to generate a first value representative of the magnetic field based on the magnetic measurement signal. It will be appreciated that the form of analog to digital conversion will be a matter of design choice to those of ordinary skill in the art. Regardless, the processing circuit 112 obtains a first value that is representative of the magnetic field.

The processing circuit 112 is further configured to determine a metering adjustment responsive to a determination that the first value exceeds a first threshold value. More specifically, the processing circuit 112 determines whether the first value indicates that the magnetic field exceeds a threshold. The threshold preferably is determined as one that corresponds to a magnetic field that can affect or distort energy consumption measurements by altering the operation of, among other things, the current sensor of the sensor circuit 110. The threshold may suitably be determined based on the minimum level of magnetic field that affects energy measurements within the meter 100 in a non-trivial manner.

The processing circuit 112 is configured to then determine a metering adjustment based on that first value. To this end, the processing circuit 112 is operably coupled to use the table 114 in the memory 106 to determine a compensation factor that corresponds to the first value, and hence, the sensed magnetic field.

The processing circuit 112 is further operable to generate energy consumption correction information based at least in part on the metering adjustment. To this end, the processing circuit 112 may suitably adjust the digital measurement signals that are used to calculate energy consumption-related values, and/or adjust the energy consumption-related values themselves, using the metering adjustment. In some cases, the generated energy consumption correction information is the "corrected" energy consumption value. In other cases, the generated energy consumption correction information is a correction energy consumption value that is to be added to the uncorrected (nominal) energy consumption information.

By way of non-limited example, in the former case, the processing circuit 112 may generated "corrected" energy consumption information as $e_{adj}$, wherein $$e_{adj} = Je_{nom},$$

and wherein $e_{nom}$ is the normally calculated (and erroneous) energy consumption calculated within the meter, and J is the metering adjustment. The value $e_{adj}$ represents the corrected energy consumption information.

In the latter case, the processing circuit 112 generates an energy consumption "correction" value, $e_{cor}$, based on the metering adjustment in the table 114. The "correction" value $e_{cor}$ can be added to the normally calculated (and erroneous) energy consumption $e_{nom}$, to produce the corrected overall energy consumption value $e_{adj}$. In other words:

$$e_{adj} = e_{nom} + e_{cor}.$$

FIG. 2 shows in further detail an exemplary meter 200 that incorporates a magnetic field compensation arrangement similar to that of FIG. 1. The meter 200 includes a housing 205 in which are disposed a metrology circuit 202, a magnetic sensor 204, a remote communication circuit 206, an optical communication circuit 220, data storage 225 and a display 230. The metrology circuit 202 further includes a sensor circuit 203, an A/D conversion unit 212, and at least a portion of a processing and control ("P&C") circuit 215.

It will be appreciated that in the exemplary embodiment, the P&C circuit 215 is disposed within a commercially available chip package 213 that includes the A/D conversion unit 212 and other circuitry normally associated with an electronic meter, such as memory 221, and clock circuitry, not shown. The commercially available chip package 213 may suitably be the Teridian TDK71M6513 measurement chip.

Referring now to the housing 205, the housing 205 may take any suitable form, and is generally configured to withstand a wide range of environmental conditions. The housing 205 also provides at least some protection against environmental conditions to the various elements disposed therein. Suitable housings for utility meters are well-known in the art.

As discussed above, the metrology circuit 202 includes the sensor circuit 203, as well as an A/D conversion unit 212 and the P&C circuit 215. The sensor circuit 203 in this embodiment includes voltage sensors 207 and current sensors 210a, 210b that are operably coupled to detect voltage and current signals representative of voltage and current provided to a load, and to generate measurement signals therefrom. In particular, the measurement signals generated by the voltage sensors 207 are analog signals each having a waveform representative of the voltage provided to the load over power lines 201a, 201b. A suitable example of a voltage sensor 207 includes resistive voltage dividers that are operably coupled to the power lines 201a, 201b. In general, if the voltage on the power lines is represented as the vector quantity $V_{line} = N \cos \theta_v$, then the voltage measurement signal is represented as $V'_{line} = \mu N \sin \theta_v$, wherein $\mu$ is the voltage division factor.

Similarly, the measurement signals generated by the current sensors 210a, 210b are analog signals each having a waveform representative of the current provided to the load. A suitable example of a current sensor 210a, 210b includes a current transformer that is disposed in a current sensing relationship with the power line signal. These and other voltage and current sensors are known in the art.

As is known in the art, a strong magnetic field in the vicinity of at least the current sensors 210a, 210b can cause error in the current measurement signals. In particular, if the current on the power line signal is represented as a vector quantity $I_{line}=M \cos \theta_i$, then a typical measurement signal may be approximated as $I_{meas}=\alpha M \cos (\theta_i+ )$, where $\alpha$ is a scalar, fractional, multiple, and is any known phase shift and/or error of the current sensor 210b. A strong magnetic field can add at least magnitude error $\beta$. Accordingly, in the presence of a magnetic field, the current measurement signal would be the erroneous value $I_{meas\_err}=\alpha\beta M \cos (\theta_i + )$. Such errors can affect the ultimate energy consumption calculations, plus any other calculates made based on current.

In this embodiment, correction is made only on the basis of the magnitude error. Thus, the erroneous current measurement may be expressed is $I_{meas\_err}=\beta*I$. Typically, the value of $\beta$ will be a fraction less than unity, thereby causing, under normal circumstances, detection and recording of less energy.

Referring again to the meter 200, the A/D conversion unit 212 may be any suitable analog-to-digital converter that is configured to sample the analog measurement signals generated by the sensor circuit 210. The A/D conversion unit 212 is operably coupled to provide the resulting digital measurement signals to the P&C circuit 215.

The P&C circuit 215 is a circuit that is configured to receive the digital measurement signals from the A/D conversion unit 212 and generate energy consumption data therefrom. According to an exemplary embodiment, the P&C circuit 215 includes digital processing circuitry that processes the digitized measurement signals to thereby generate the energy consumption data. The A/D conversion unit 212 is configured to generate sampled version of the detected voltage waveforms (as scaled by the voltage sensors 207) and sampled versions of the detected current waveforms (as scaled by the current sensors 210a, 210b). The P&C circuit 215 is configured to sum the products of contemporaneous voltage samples $V_n$ and current samples $I_n$ to generate energy measurement signals, as will be discussed below in further detail. In general, circuits capable of such energy measurement calculations, based on voltage and current samples, are well known in the art.

In addition, the P&C circuit 215 includes further functionality configured to exercise general supervisory control over data transmission, data display and data storage within the meter 200. In this embodiment, the P&C circuit 215 is also configured to perform extraneous magnetic field detection, notification and correction as described herein.

Accordingly, the P&C circuit 215 performs energy data processing, as well as controller operations. In an alternative embodiment, the P&C circuit 215 may be split into two separate devices, such as a digital signal processor ("DSP") and a controller, to carry out these tasks.

The memory 221 of the chip package 213 includes one or more storage devices of different types. The memory 221 may include volatile or non-volatile RAM, EEPROM, or other readable and writeable memory device, any of which may be incorporated into the integrated circuit package 213. The memory 221 stores instructions and/or parameters used by the P&C circuit 215, and may further store energy consumption data. By contrast, the memory 225 is external to the chip package 213, and provides for extended data storage. Such memory 225 would also, however, be located within the housing 205.

The memory 221 stores, among other things, one or more tables that correlate magnetic field measurement values to correction values. Specifically, the table 305 includes a first set of correction values COR, each value representative of a current magnitude correction corresponding to a value MV, which in turn is representative of a magnetic field measurement. Similarly, the table 310 includes a second set of correction values COR, each value representative of a current magnitude correction corresponding to a magnetic field value MV.

In this embodiment, the two tables 305, 310 are employed in order to apply different correction for different ranges of power line input current. In particular, it is known that certain current sensors behave differently based on the level of current within the transformer coils. Accordingly, current sensor errors due to magnetic field may change depending on the magnitude of current being measured. Therefore, it may be advantageous in some cases to employ different correction tables for different measured current ranges. In this example, if the current measured on the power lines 201a, 201b is less than or equal to 30 A RMS, then the table 305 may be used for correction, and if the current is greater than 30 A RMS, then the table 310 may be used for correction. While other thresholds can be employed, it is nevertheless advantageous to account for the fact that magnetic fields may affect different magnitudes of current in different ways.

In this embodiment, it will be appreciated that the tables 305, 310 only include current magnitude correction values. In some embodiments, it may be advantageous to include phase correction values if it is determined experimentally that the magnetic field affects the phase measurement of the current sensors 210b.

In this embodiment, the correction values COR are chosen such that they are multiplied by the measured current to provide an estimated current correction value, $I_{corr}$. In other words, $I_{corr}=VAL*I_{err\_meas}$. The current correction value, $I_{corr}$, when added to the erroneous measured current, $I_{err\_meas}$, is approximately equal to the actual current I. Thus, if the erroneous current $I_{err\_meas}$ is equal to $\beta I$, then the correction value COR is set to approximate $(1-\beta)/\beta$. In other words, the correction value $I_{corr}$ can be expressed as the value that is summed with the erroneous measured current to obtain the actual current I:

$$I=I_{err\_meas}+I_{corr}$$

As discussed above, $I_{corr}$ is determined using the measured current $I_{err\_meas}$ and the correction value COR. Therefore:

$$I=I_{err\_meas}+VAL*I_{err\_meas},$$

which is shown to be accurate by simple substitution. For example, as discussed above, $$I_{err\_meas}=\beta I \text{ or } \beta*I,$$

therefore, $$I=(\beta*I)+COR*(\beta*I),$$

and since COR is represented by $(1-\beta)/\beta$, if follows that:

$$I=(\beta*I)+\{(1-\beta)/\beta\}*(\beta*I),$$

and simplifying:

$$I=(\beta*I)+\{(1-\beta)\}*(I)$$

$$I=(\beta*I)+(I*1)-(\beta*I)$$

$$I=I$$

Accordingly, if the error due to the magnetic field scales the actual measured current by a factor $\beta$, then the correction factors COR in this embodiment are an approximation of value of $(1-\beta)/\beta$.

Figure 5:
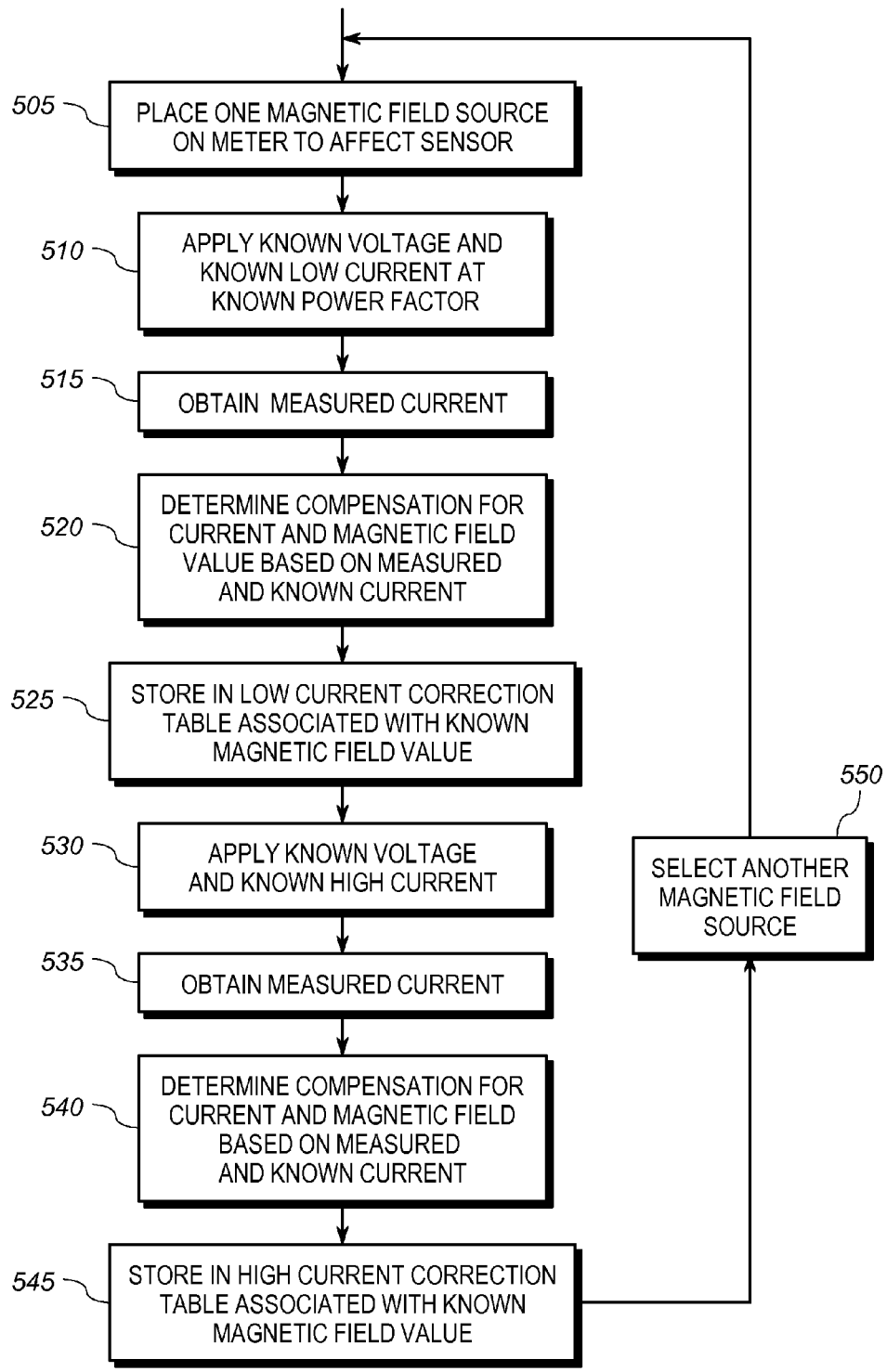
FIG. 5 shows an exemplary flow diagram of operations that may be carried out to generate a table correlating magnetic field values to metering adjustment or correction factors.

It will further be appreciated that the development of the correction tables may be readily accomplished by those of ordinary skill in the art. Referring to FIG. 5, a correction table development process is shown in flow diagram form. The process only requires a source of known voltage and current, a plurality of sources of known magnetic fields, not shown, and the meter 200 under test.

In step 505, one of the plurality of sources of known magnetic field is placed on the meter such that the field affects the current sensor. In step 510, a known voltage VK and low current IK_L is applied to the measurement circuit of the meter 200. The voltage and current VK and IK_L are preferably in phase, with a power factor of 1. In step 515, the measured current IM_L is obtained. To this end, the technician may obtain the measured current IM_L using the energy consumption as displayed on the display 230, and solving for current using the known voltage VK and power factor. Alternatively, the meter 200 may have the ability to display 230 current magnitude (rms current) on its display. In either event, in step 520, the compensation value COR is calculated by calculating β as follows:

$$\beta = IM\_L/IK\_L.$$

and then setting $COR=(1-\beta)/\beta$.

In step 525, the value COR is stored in the low current correction table 305 and is associated therein with the magnetic field value of the known magnetic field applied in step 505.

In step 530, a known voltage VK and high current IK_H is applied to the measurement circuit of the meter 200. Again, the voltage and current VK and IK_H are preferably in phase, with a power factor of 1. In step 535, the measured current IM_H is obtained in the same manner as in step 515. Thereafter, in step 540, the compensation value COR is calculated by calculating β as follows:

$$\beta = IM\_H/IK\_H.$$

and then setting $VAL=(1-\beta)/\beta$.

In step 545, the value COR is stored in the high current correction table 310 and is associated therein with the magnetic field value of the known magnetic field applied in step 505.

Thereafter, another magnetic field source with a different known value is selected (step 550) and the process is repeated using the selected magnetic field source and returning to step 505. When values COR associated with magnetic fields for all of the plurality of magnetic fields have been stored in tables 305, 310, then the process is completed. It will be appreciated that additional correction values COR associated with other magnetic field values may be determined using interpolation and/or extrapolation of the experimentally determined values.

It will further be appreciated that the development of the tables 305, 310 may be performed for each individual meter 200. Alternatively, a single set of tables 305, 310 may be generated once for use in a large number of meters manufactured with substantially the same components. It will also be appreciated that the tables 305, 310 may be replaced with equations/relationships that provide a value of COR as function of magnetic field. Multiple of such relationships may be generated for different levels of input current. To this end, a number of values of COR may be generated using the method described above in connection with FIG. 5. In addition, however, the various values may be used to generate a function curve using one or more known methods of generating functions from observed data. Such curve definitions would be stored in the memory 221.

In any event, referring again to FIG. 2, the memory 221 in this embodiment further stores a threshold TH for flagging (and compensating for) detected magnetic fields. As will be discussed below in further detail, the detected magnetic field must exceed the threshold TH before the meter 200 will recognize a magnetic field fault.

The optical communication circuit 220 is operably coupled to the P&C circuit 215. The optical communication circuit 220 in this embodiment includes an optical transceiver, both of which are located at a translucent or transparent optical port, not shown. Similarly, the remote communication circuit 206 is operably coupled to the processing circuit 215. The remote communication circuit 206 may suitably be a power line modem, an RF transceiver, for example, a pager radio, or other wireless device that is capable of transmitting on a WAN, or on another wireless communication network.

The display 230 is operably coupled to the P&C circuit 215 and provides a visual display of information, such as information regarding the operation of the meter 200. For example, the display 230 may provide a visual display of information relating to the power measurement operations or energy consumption data of the meter 200.

The meter 200 also includes a power supply 211 operably connected to receive power from the power lines 201. The power supply 211 is configured to generate bias power for the circuitry of the meter 200 discussed above, including the chip package 213, the display 230, and the communication circuits 206 and 220.

In normal energy delivery operation, the metrology circuit 202 performs operations to detect electrical signals on the power lines 201a, 201b and generating metering information therefrom. To this end, the voltage sensor 207 detects the voltages on the utility power lines 201a, 201b, and generates analog voltage measurement signals Va(t) and Vb(t) that are scaled versions of the voltage waveforms on, respectively, the power lines 201a, 201b. Similarly, the current sensors 210a, 210b generate analog current measurement signals Ia(t) and Ib(t) representative of the detected current waveform on the power lines 201a, 201b.

The voltage sensor 207 provides the voltage measurement signals Va(t) and Vb(t) to the A/D converter 212. Similarly, the current sensors 210a, 210b provide the current measurement signals Ia(t) and Ib(t) to the A/D converter 212. The A/D converter 212 samples the analog measurement signals Va(t), Vb(t), Ia(t) and Ib(t), and thereby generates sampled digital measurement signals Vsa(n), Vsb(n), Isa(n) and Isb(n).

During normal operation, the P&C circuit 215 accumulates one or more energy consumption values based on the digital measurement signals Vsa(n), Vsb(n), Isa(n) and Isb(n), and stores them in the primary register 315 of the memory 221. The P&C circuit 215 also obtains a magnetic field value based on the output of the magnetic sensor 204. The magnetic field value is representative of the magnitude of the magnetic field in the vicinity of the current sensors 210b (and/or voltage sensors 210a). If the magnetic field value exceeds a predetermined threshold, such as the corresponding threshold TH 325 in the memory 221, then P&C circuit 215 generates additional estimated energy consumption values for storage in the auxiliary register 320. The P&C circuit 215 also stores a flag indicating a magnetic field fault event and a corresponding time stamp.

Figure 4:
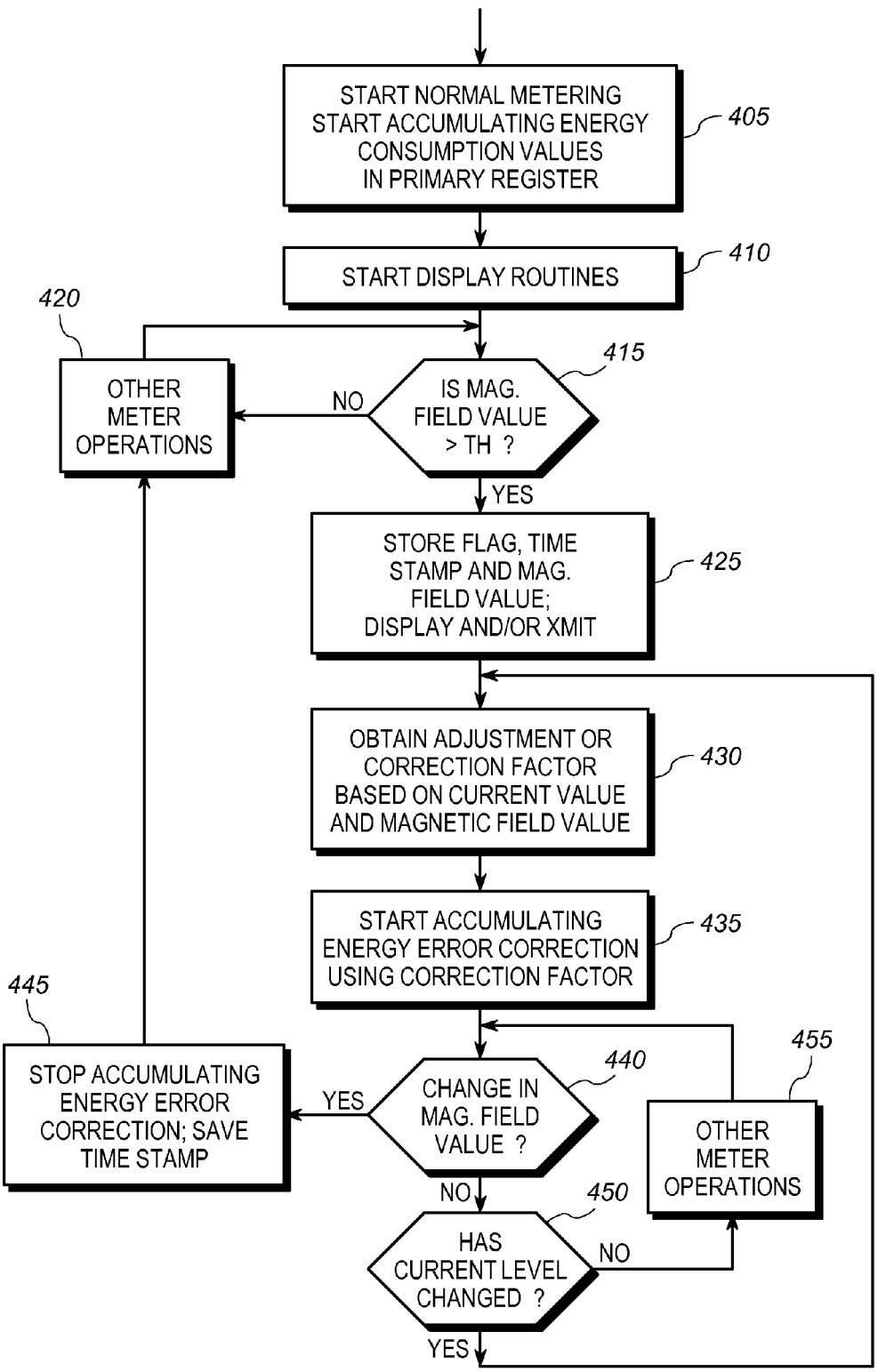
FIG. 4 is a flow diagram of an exemplary set of operations that may be carried out by the processing circuit of the meter of FIG. 2.

FIG. 4 shows in further details the operation of the P&C circuit 215 in carrying out the above-described operations. In particular, in step 405, which may suitably occur after a meter startup or reset, the P&C circuit 215 starts performing normal ongoing metering operations, such as calculating and registering energy consumption information identifying the energy usage of the load. These operations continue while the remaining steps of FIG. 4 are carried out.

In further detail, the P&C circuit 215 calculates energy using the sampled digital measurement signals Vsa(n), Vsb(n), Isa(n) and Isb(n) received from the sensor circuit 203 via the A/D converter 212. In general, various methods of performing such calculations are known in the art. In this embodiment, the P&C circuit 215 first calculates instantaneous sample energy values $P_a$ and $P_b$ using the following relationships:

$$P_a(n)=Vsa(n)*Isa(n)$$

$$P_b(n)=Vsb(n)*Isb(n)$$

However, it will be appreciated that depending on the type of current sensors 210a, 210b used, some phase adjustment may be made to the current samples (and/or voltage samples) to accurately reflect the true phase relationship of the voltage and current on the power lines 201a, 201b. Such phase adjustment may involve employing a predetermined delay between the voltage and current samples that are multiplied together. Thus, for example, the instantaneous sample energy values may be calculated as follows:

$$P_a(n)=Vsa(n+_a)*Isa(n)$$

$$P_b(n)=Vsb(n+_b)*Isb(n)$$

where $_a$ and $_b$ are phase adjustments (in terms of a sample delay) for the corresponding measurement signals of power lines 201a and 201b, respectively.

Figure 3:
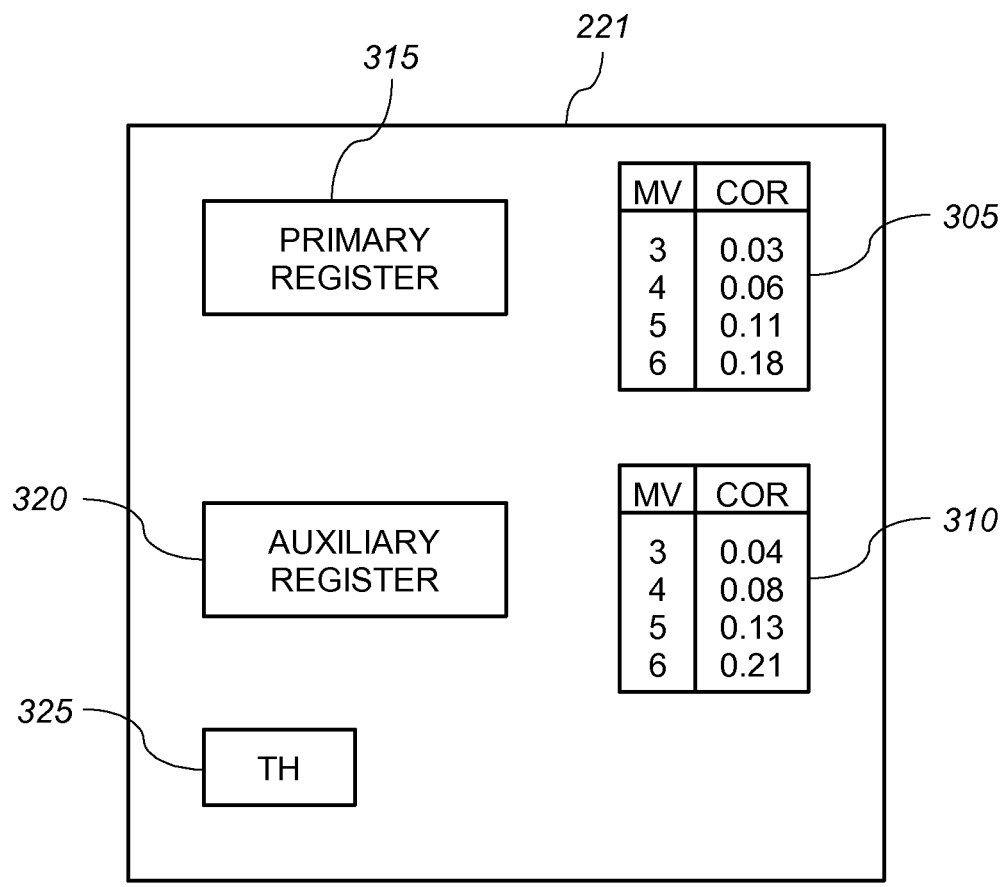
FIG. 3 is a schematic block diagram of a memory device of the meter of FIG. 2.

In any event, the calculated instantaneous sample energy values $P_a(n)$ and $P_b(n)$ represent the consumed energy on the power lines 201a, 201b, respectively, for the time duration of a sample centered around n, for example, a time duration t for $n-\frac{1}{2}<t<n+\frac{1}{2}$. The P&C circuit 215 then accumulates these instantaneous sample energy values $P_a(n)$ and $P_b(n)$ over time, on an ongoing basis, to generate an energy consumption value E(n), for each sample n:

$$E(n)=E(n-1)+P_a(n)+P_b(n)$$

where E(n-1) is the prior energy consumption value retrieved from the primary register 315 and E(n) is the new energy consumption value. The accumulated energy consumption value E(n) is stored in the primary register 315 (see FIG. 3). The P&C circuit 215 may suitably cause display of the current accumulated consumption value E(n) in the display 230. This process is repeated on an ongoing basis for every sample n of the voltage and current signals.

It will be appreciated that the P&C circuit 215 may also (or alternatively) calculate other energy consumption-related values, such as apparent power (VA), reactive power (VAR), RMS voltage, RMS current, and other values. The calculation of such values from the digital voltage and current measurement signals Vsa(n), Vsb(n), Isa(n) and Isb(n) would be known to those of ordinary skill in the art.

In addition to the ongoing detection, calculation and storage of energy consumption information, the P&C circuit 215 performs other functions. For example, in step 410, the P&C circuit 215 starts ongoing execution of a predetermined display routine. The display routine is a set of instructions that are executed by the P&C circuit 215 to cause the display 230 to display various types of information, including indications of the accumulated energy consumption value or values. Various display routines for ordinary metering operations are known in the art. The display routines of step 410 also operate on an ongoing basis throughout the operations of FIG. 4.

As indicated in step 415, the P&C circuit 215 from time to time determines whether the magnetic field value received from of the magnetic sensor 204 exceeds a threshold TH, thereby indicating a magnetic field fault. To this end, the P&C circuit 215 obtains the magnetic field value from the magnetic sensor 204. As discussed above, the value may be provided via the A/D converter 212, or through some other means, including an inherent analog input of the chip 113 that is configured to generate a digital representation of the voltage at the input.

In the particular operation of step 415, the P&C circuit 215 determines whether the magnetic field value exceeds the threshold TH for a predetermined time, such as 1 to 60 seconds. Accordingly, the magnetic field value must exceed the threshold TH for the predetermined time, and not just for an instant. This allows for the magnetic field to be settled in a fixed position. More specifically, attempts at tampering using magnetic fields may involve experimental placement of an external magnet in a plurality of positions. The delay in detecting whether the field exceeds the threshold allows time for the external magnet to be settled into a fixed position.

If the P&C circuit 215 determines that the magnetic field value does not exceed the threshold TH for the predetermined time period, then the P&C circuit 215 proceeds to step 420. If, however, the P&C circuit 215 determines that the magnetic field value exceeds the threshold TH for the predetermined time period, then the P&C circuit 215 executes step 425 to begin processing the magnetic field fault.

In step 420, the P&C circuit 215 performs other periodic processes as would be known in the art. Such periodic processes may involve communication with a remote device, monitoring for other tamper detection signals, monitoring for inputs from the optical communication circuit 220, and the like. After one or more such other process take place, the P&C circuit 215 returns to step 415 to check again for excessive magnetic field values. It will be appreciated that the operations of steps 405, 410, 415 and 420 may typically be carried out by an operating system that schedules different tasks based on time and a number of other factors, such as priority, as is known in the art.

Referring again specifically to a magnetic field fault detection, the P&C circuit 215 in step 425 stores, in the memory 221 or memory 225, a record of the detected magnetic field event. In this embodiment, the record includes a time stamp, an indication of the fault (i.e. a tamper flag), and the detected magnetic field value. In some embodiments, the P&C circuit 215 also causes the remote communication circuit 206 to transmit the record (and/or the indication of the fault itself) to a remote device, such as a utility company computer. In some embodiments, the P&C circuit 215 will also cause the display 230 to display a visual indication of the detected fault.

It will be appreciated that despite the detected fault, the P&C circuit 215 continues to determine the energy consumption values $P_a(n)$, $P_b(n)$ and store the ongoing accumulation value E(n) in the primary register 315 in the same manner as discussed above. The nominal energy consumption value E(n), however, will have error caused by the magnetic field. As will be discussed below, however, the P&C circuit 215 also records an accumulated error correction value $E_{err}(n)$ which represents an estimate of the difference between the incorrect recorded value E(n) and the actual energy consumed. As will be discussed below in detail, the value $E_{err}(n)$ is an ongoing accumulation of instantaneous energy error estimates $P_{a\_err}(n)$, $P_{b\_err}(n)$. The value $E_{err}(n)$ is stored in the auxiliary register 320 (see FIG. 3). Thus, an estimate of the energy actually consumed, with adjustment for magnetic error, is the sum of the values E(n) of the primary register 315 and $E_{err}(n)$ of the auxiliary register 320.

More specifically, in step 430, the P&C circuit 215 obtains from the memory 221 the appropriate adjustment value adj_a, adj_b for each current sensor 210a, 210b based on the respective measured input currents and the magnetic field value MV. The P&C circuit 215 may suitably determine the measured input currents as RMS calculations, a simplified version of which is provided below:

$$Ia\_rms = \Sigma I_a(n)^2, \text{ and}$$

$$Ib\_rms = \Sigma I_b(n)^2,$$

for a window of samples n covering several AC cycles.

If the RMS current Ia_rms exceeds a predetermined threshold, for example, 30 amps, then the P&C circuit 215 retrieves the adjustment value COR corresponding to the magnetic field value from the table 310. If the RMS current Ia_rms does not exceed a predetermined threshold, then the P&C circuit retrieves the adjustment value COR corresponding to the magnetic field value from the table 305. The P&C circuit then sets adj_a for the power line 201a to the retrieved adjustment value COR.

A similar process is repeated to determine the adjustment adj_b for the power line 201b. If the RMS current Ib_rms exceeds a predetermined threshold, for example, 30 amps, then the P&C circuit 215 retrieves the adjustment value COR corresponding to the magnetic field value from the table 310. If the RMS current Ib_rms does not exceed a predetermined threshold, then the P&C circuit retrieves the adjustment value COR corresponding to the magnetic field value from the table 305. The P&C circuit 215 then sets adj_b for the power line 201b to the retrieved adjustment value COR for the power line 201.

The P&C circuit 215 thereafter proceeds to step 435. In step 435, the P&C circuit 215 starts accumulating the estimated energy consumption error $E_{err}(n)$ on an ongoing basis using the operations described below. For each sample n, the P&C circuit 215 determines instantaneous errors $P_{a\_err}(n)$, $P_{b\_err}(n)$ based on the adjustment values adj_a, adj_b obtained in step 430. The instantaneous errors are calculated using the formulas:

$$P_{a\_err}(n) = Vsa(n+_a) \cdot Isa(n) \cdot \text{adj\_a}$$

$$P_{b\_err}(n) = Vsb(n+_b) \cdot Isb(n) \cdot \text{adj\_b}$$

The P&C circuit 215 then accumulates the values $P_{a\_err}(n)$, $Pi_{b\_err}(n)$ in the auxiliary register 320. In particular, the P&C circuit 215 determines an accumulated consumption error $E_{err}(n)$ as follows:

$$E_{err}(n) = E_{err}(n-1) + P_{a\_err}(n) + P_{b\_err}(n)$$

where $E_{err}(n-1)$ is the prior energy consumption error value retrieved from the auxiliary register 320 and $E_{err}(n)$ is the new energy consumption error value. The accumulated energy consumption error value $E_{err}(n)$ is stored in the auxiliary register 320 (see FIG. 3).

Thereafter, in step 440, the P&C circuit 215 from time to time determines whether the magnetic field value has changed from the previously detected value from step 415. To this end, the P&C circuit 215 determines whether the magnetic field value has changed and has remain changed from the previously detected value for more than a predetermined period of time. If the magnetic field value has changed and has remained changed for a predetermined period of time, then the P&C circuit 215 proceeds to step 445. If not, then the P&C circuit 215 proceeds to step 450 to determine if the current has changed such that a different table correction value should be used.

To this end, in step 450, the P&C circuit 215 determines whether the input current (Ia_rms or Ib_rms) on either line 201a or 201b has transitioned from above the threshold TH to below the threshold TH or vice versa. If so, then the P&C circuit 215 returns to step 430 to obtain new correction values and proceeds accordingly. If not, then the P&C circuit 215 in step 455 performs other meter operations, similar to step 420. After step 455, the P&C circuit 215 returns to periodically check for changes in the magnetic field value in step 440.

In step 445, because it has been determined that the magnetic field has remained changed for a predetermined period of time, the P&C circuit 215 stores the time stamp and an indication of the end of the magnetic fault event in the memory 221 and/or memory 225. The P&C circuit 215 furthermore stops accumulating the error value $E_{err}(n)$. However, the value $E_{err}(n)$ remains stored in the auxiliary register 320. Indeed, the error value $E_{err}(n)$ may also be displayed on an ongoing basis thereafter.

The change in detected magnetic field may occur as a result of the removal of the external magnet from the meter 200. However, the P&C circuit 215 in step 445 records the end of the event even if the magnetic field value has actually increased, because in such a case, a new event is recorded. Regardless, the P&C circuit 215 thereafter proceeds to step 415 to again determine whether the new magnetic field value exceeds the appropriate threshold and proceeds accordingly.

Thus, the operations of FIG. 4 discussed above provide a method of estimating actual energy usage, despite tampering using a magnet, or other interference involving a magnetic field. The estimated usage, at all times, regardless of the number of magnetic field events, is equal to the sum of nominally calculated energy consumption value E(n) stored in the primary register 315, and the calculated energy consumption error $E_{err}(n)$ stored in the auxiliary register 320.

One of the results of using separate registers for the erroneous calculation and the calculated error is that the erroneous original calculation is preserved. Accordingly, the actual amount of energy used may be determined by adding the values $E_{err}(n)$ and E(n), while nevertheless preserving the original calculation E(n).

It will be appreciated, however, that in other embodiments, the P&C circuit 215 may simply calculate and store an adjusted energy consumption value in the primary register 315. In such a case, the tables 305 and 310 can contain factors that merely change the value E(n) to a corrected $E_{corr}(n)$. Such an embodiment has the advantage of avoiding the need for a separate auxiliary register 320, and avoiding the need for accumulating an additional energy value $E_{err}(n)$.

It will further be appreciated that the above described embodiments are provided by example only, and that those of ordinary skill in the art may readily devise their own implementations and modifications that incorporate the principles of the present invention and fall within the spirit and scope thereof.

By way of example, it will be appreciated that the exact metering calculation described herein is given by way of example only, in order to demonstrate one manner in which an error value may be obtained using the corrections values. Various other meter calculations are known in the art. Those of ordinary skill in the art may readily adapt usage of the correction value for such calculations. For example, any metering calculation using current sample values may be corrected using methods described herein. It will further be appreciated that the auxiliary register 320 may store accumulated energy consumption error values for each phase, instead of a single combined consumption error value $E_{err}(n)$. Such per phase accumulated energy consumption error values could then be combined at a later point in the meter processing.

Furthermore, while the specific embodiment shows implementation within a two-phase power service, it will be appreciated that the error correction operations of FIG. 4 (and other operations and structures described herein) may readily be adapted to meters measuring three-phase power service. For example, the accumulated error value in such a case would be:

$$E_{err}(n)=E_{err}(n-1)+P_{a\_err}(n)+P_{b\_err}(n)+P_{c\_err}(n),$$

wherein $P_{c\_err}(n)$ is the calculated error value in phase C, determined in an manner analogous to that used to determine $P_{a\_err}(n)$, and $P_{b\_err}(n)$.

I claim:

1. An arrangement for use in an electricity meter, comprising:
    a sensor supported directly or indirectly by a meter housing, the sensor configured to measure a magnetic field in proximity to a current sensor of the electricity meter, the magnetic field generated at least in part by a source independent of line current, the sensor configured to generate a measurement signal representative of, at least in part, a magnitude of the magnetic field;
    a processing circuit operably coupled to receive first information representative of the measurement signal and operably coupled to receive current measurement information representative of a current measurement signal generated by the current sensor based on the line current, the processing circuit configured to
        obtain a first value representative of the magnetic field based on the first information;
        determine a first adjustment value responsive to a determination that the first value exceeds a first threshold value; and
        generate energy consumption information based at least in part on the first adjustment value and the current measurement information; and
    a memory storing information correlating magnetic values and current measurement information to adjustment values, and wherein the processing circuit is further configured to determine the first adjustment value using at least part of the stored information correlating magnetic values and current measurement information to adjustment values.

2. The arrangement of claim 1, wherein the processing circuit is further configured to store a tamper flag in the memory responsive to the determination that the first value exceeds the first threshold value.

3. The arrangement of claim 1, wherein the processing circuit further performs at least some of the operations of a metrology circuit of the electricity meter.

4. The arrangement of claim 1, wherein the memory is a non-volatile memory.

5. The arrangement of claim 1, further comprising a communication circuit, and wherein the processing circuit is further configured to cause the communication circuit to communicate the generated energy consumption information to a remote device.

6. The arrangement of claim 1, wherein the stored information includes a first set of adjustment values corresponding to a first plurality of magnetic values for a first range of current measurement information, and a second set of adjustment values corresponding to a second plurality of magnetic values for a second range of current measurement information.

7. The arrangement of claim 6, wherein the processing circuit is further configured to determine the first adjustment value by:
    determining if the current measurement information exceeds a predetermined threshold;
    obtaining the first adjustment value from a select one of the first set of adjustment values and the second set of adjustment values based on whether the current measurement information exceeds a predetermined threshold.

8. A method for use in an electricity meter, comprising:
    a) obtaining a first value representative of a magnetic field in proximity to a current sensor of the electricity meter;
    b) employing a processing circuit to determine a first adjustment value responsive to a determination that the first value exceeds a first threshold value, the first threshold value corresponding to a magnetic field strength sufficient to cause an error in current measured by the current sensor; and
    c) generating energy consumption information in the electricity meter based at least in part on the first adjustment value; and
    d) employing the processing circuit to determine the first adjustment value using at least part of information stored in a memory, the stored information correlating magnetic values and current measurement values to adjustment values.

9. The method of claim 8, further comprising storing a tamper flag in the memory responsive to the determination that the first value exceeds the first threshold value.

10. The method of claim 8, further comprising employing the processing circuit to perform at least some of the operations of a metrology circuit of the electricity meter.

11. The method of claim 8, wherein the memory is a non-volatile memory.

12. The method of claim 8, wherein the generated energy consumption information is representative of a difference of a first energy consumption value determined by the meter and the actual energy consumption.

13. The method of claim 12, further comprising employing the processing circuit to determine the first energy consumption value independent of whether the first value exceeds the first threshold value.

14. The method of claim 13, further comprising storing the first energy consumption value in a first register, and storing the generated energy consumption value in a second register.

15. The method of claim 8, further comprising causing a communication circuit to communicate the generated energy consumption information to a remote device.

16. The method of claim 8, wherein the generated energy consumption information is based on a nominal energy consumption information and the first adjustment value.

17. The method of claim 8, wherein the stored information includes a first set of adjustment values corresponding to a plurality of magnetic values for a first range of current measurement values, and a second set of adjustment values corresponding to a plurality of magnetic values for a second range of current measurement values.

18. The arrangement of claim 17, wherein the stored information includes a first table comprising the first set of adjustment values and the first plurality of magnetic values, and a second table comprising the second set of adjustment values and the second plurality of magnetic values.

* * * * *